United States Patent
Pfirsch (10) Patent No.: US 7,791,138 B2
(45) Date of Patent: Sep. 7, 2010

(54) SEMICONDUCTOR COMPONENT AND METHOD

(75) Inventor: Frank Pfirsch, Munich (DE)

(73) Assignee: Infineon Technologies Austria AG, Villach (AT)

( * ) Notice: Subject to any disclaimer, the term of this patent is extended or adjusted under 35 U.S.C. 154(b) by 7 days.

(21) Appl. No.: 12/261,838

(22) Filed: Oct. 30, 2008

(65) Prior Publication Data
US 2009/0108303 A1    Apr. 30, 2009

(30) Foreign Application Priority Data
Oct. 30, 2007    (DE) .................. 10 2007 052 202

(51) Int. Cl.
*H01L 29/76*    (2006.01)
*H01L 29/94*    (2006.01)
*H01L 27/095*   (2006.01)

(52) U.S. Cl. .................. 257/337; 257/341; 257/476; 257/E29.271; 257/E29.311

(58) Field of Classification Search .................. 257/337, 257/341, E29.271, E29.311
See application file for complete search history.

(56) References Cited

U.S. PATENT DOCUMENTS

| | | | |
|---|---|---|---|
| 4,754,310 A | 6/1988 | Coe | |
| 5,216,275 A | 6/1993 | Chen | |
| 6,184,545 B1 | 2/2001 | Werner et al. | |
| 6,313,482 B1 | 11/2001 | Baliga | |
| 6,475,864 B1 * | 11/2002 | Sato et al. | 438/268 |
| 6,743,703 B2 | 6/2004 | Rodov et al. | |
| 7,061,066 B2 | 6/2006 | Kocon | |
| 2002/0171093 A1 * | 11/2002 | Onishi et al. | 257/197 |
| 2006/0137600 A1 * | 6/2006 | Ellison et al. | 117/19 |
| 2009/0114924 A1 * | 5/2009 | Ellison et al. | 257/77 |

FOREIGN PATENT DOCUMENTS

| | | |
|---|---|---|
| DE | 10337457 | 1/2005 |
| DE | 10326739 | 3/2005 |

OTHER PUBLICATIONS

Fujihira et al., "Simulated Superior Performances of Semiconductor Superjunction Devices", Proceedings of 1998 Int'l Symposium on Power Semiconductor Devices & ICs, Kyoto, pp. 423-426.

* cited by examiner

*Primary Examiner*—Ngan Ngo
(74) *Attorney, Agent, or Firm*—Dicke, Billig & Czaja, PLLC

(57) ABSTRACT

A semiconductor component and method of making a semiconductor component. One embodiment provides a first metallization structure electrically coupled to charge compensation zones via an ohmic contact and to drift zones via a Schottky contact. A second metallization structure, which is arranged opposite the first metallization structure, is electrically coupled to the charge compensation zones via a Schottky contact and to drift zones via an ohmic contact.

14 Claims, 8 Drawing Sheets

SEMICONDUCTOR COMPONENT AND METHOD

CROSS-REFERENCE TO RELATED APPLICATIONS

This Utility patent application claims the benefit of the filing of German Application DE 10 2007 052 202.0, filed Oct. 30, 2007, incorporated by reference herein.

BACKGROUND

The invention relates to a semiconductor component and a method for producing the same.

Semiconductor components including Schottky metal contacts are known from the document DE 103 26 739 B3. In the case of the known component, charge compensation zones are likewise provided in the drift path. In the case of the known semiconductor component, the charge compensation zones are configured in such a way that premature commencement of bipolar injection is suppressed. In order to set the commencement of the charge carrier flooding in forward operation and thus the overcurrent strength, a Zener diode is additionally also provided in the case of the known semiconductor component including Schottky metal contacts.

Schottky diode contact junctions, on the one hand, and pn and also pin diode junctions, on the other hand, fundamentally differ from one another with regard to their on-state behavior and their switching behavior. Schottky diode junctions are distinguished by a unipolar current transport at a low threshold voltage of the order of magnitude of approximately 0.2 to 0.4 volt and enable very fast switching. At high current densities, however, the forward voltage of Schottky diodes increases greatly. By contrast, pin diodes, owing to their bipolarity, utilize the injection of minority charge carriers and also of majority charge carriers in their base zone when a specific threshold voltage of approximately 0.7 V is reached in order to reduce the base resistance in forward operation. A type of plasma flooding occurs here in the on-state case of the pin diode as a result of the injection of the minority charge carriers and the majority charge carriers. This plasma flooding that lowers the base resistance adversely affects the switching losses that arise, however, when the pin diode is switched off, since the introduced charge carriers have to be fully depleted and this depletion has to take place at a negative voltage already present.

Consequently, Schottky diode junctions are advantageous with regard to their switching behavior, but have disadvantages at high current densities. Furthermore, the use of Schottky diode junctions in the range of higher reverse voltages is limited by the large proportion of the reverse current in the total losses. This is because in the case of Schottky diodes the reverse current is fundamentally determined by the magnitude of the electric field present at the metal-semiconductor junction. Moreover, for unipolar components that operate with Schottky contacts, a more than quadratic relationship holds true between their forward resistance and their blocking capability. This relationship also imposes relatively narrow limits on the design of semiconductor components including Schottky contacts.

The document mentioned above proposes a plurality of solutions for overcoming disadvantages for semiconductor components including Schottky metal contacts. Firstly, it is proposed to use superjunction structures, about which it is known that low on resistances can be combined with a high breakdown voltage on account of the arrangement of drift zones of a first conduction type and adjacent charge compensation zones of a complementary conduction type with respect to the first conduction type. As mentioned above, Schottky diode junctions exhibit a significantly lower threshold voltage than pn or pin diodes of the same semiconductor material. Furthermore, the Schottky diode junctions have the advantage of a vanishingly small reverse recovery charge.

However, on account of the low doping of the drift zones and the corresponding length necessary for achieving the high reverse voltage, diodes of this type have a high forward resistance. A combination, however, such as is already known from the document mentioned above, of Schottky diodes with superjunction drift path structures yields, in principle, semiconductor components having comparatively low resistance in conjunction with a constantly high reverse voltage.

In the case of these structures, the problem nevertheless remains that minority charge carrier injection already commences at a low forward voltage of the order of magnitude of the threshold voltage of a bipolar diode, such that a semiconductor component of this type reacts more or less like a bipolar diode. Thus, even with the combination of a superjunction semiconductor component and a Schottky metal contact as first metallization structure, the advantage of the vanishing reverse recovery charge is nullified.

One of the solutions disclosed by the document mentioned above provides for the first metallization structure to have Schottky metal contacts including different materials for the charge compensation zones and for the drift zones of a superjunction semiconductor component. However, this measure functions only in a very limit forward voltage range. A second known solution consists, then, in providing an additional pn junction between an anode contact of a diode and the charge compensation zones, which prevents charges from passing into the charge compensation zones during the on-state phase.

However, parasitic npn transistors with an open base arise in the case of this solution, which significantly reduces the breakdown voltage of such semiconductor components. A third known solution provides for providing an additional "threshold component" between the charge compensation zones and the anode contact, which makes it possible for a current flow to take place through the charge compensation zones only at a specific threshold voltage. Zener diode structures or MOSFET structures with short-circuited gate-drain terminals can be used for this purpose.

The document DE 103 37 457 B3 furthermore discloses transistor components having an improved reverse current behavior in which the abovementioned structures with Schottky metal contacts are used.

For these and other reasons, there is a need for the present invention.

SUMMARY

One embodiment provides a semiconductor component. A first metallization structure is electrically coupled to the charge compensation zones via an ohmic contact and to drift zones via a Schottky contact. A second metallization structure, which is arranged opposite the first metallization structure, is electrically coupled to the charge compensation zones via a Schottky contact and to the drift zones via an ohmic contact.

BRIEF DESCRIPTION OF THE DRAWINGS

The accompanying drawings are included to provide a further understanding of the present invention and are incorporated in and constitute a part of this specification. The drawings illustrate the embodiments of the present invention and together with the description serve to explain the principles of the invention. Other embodiments of the present invention and many of the intended advantages of the present invention will be readily appreciated as they become better understood by reference to the following detailed description. The elements of the drawings are not necessarily to scale relative to each other. Like reference numerals designate corresponding similar parts.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

One or more embodiments provide a semiconductor component and a method for producing the same in which the previously limited possibilities of the use of Schottky contacts are overcome in such a way as to provide semiconductor components having a significantly improved switching behavior in conjunction with unchanged high breakdown voltage and low on-state losses whilst avoiding minority charge carrier injection with at the same time vanishing reverse recovery charge with a drift path structure including drift zones and charge compensation zones.

One or more embodiments provide a semiconductor component and a method for producing the same. In one embodiment, the semiconductor component has a semiconductor chip structure with a semiconductor body and a drift path structure. The drift path structure has drift zones of a first conduction type and charge compensation zones of a complementary conduction type with respect to the first conduction type. Furthermore, the semiconductor component has two metallization structures lying opposite one another, which are electrically operatively coupled to one another via the drift path structure. At least one of the metallization structures forms Schottky metal contacts to the semiconductor body.

Figure 1:
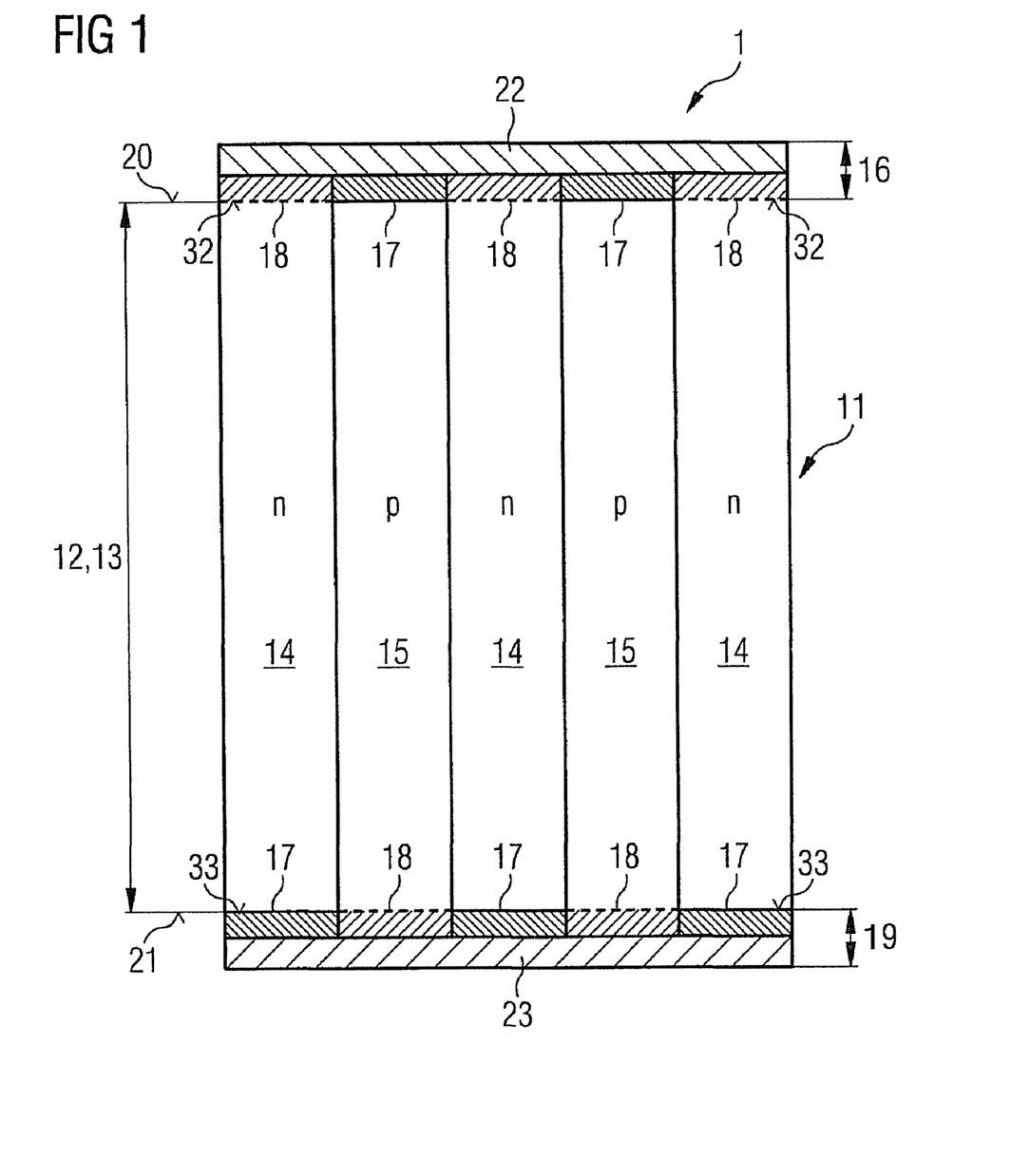
FIG. 1 illustrates a schematic cross section through a partial region of a semiconductor chip structure for a semiconductor component of one embodiment.

FIG. 1 illustrates a schematic cross section through a partial region of a semiconductor chip structure 11 for a semiconductor component 1 of one embodiment. The semiconductor component 1 has a semiconductor chip structure 11 with a semiconductor body 12 having a drift path structure 13. The drift path structure 13 has drift zones 14 of a first conduction type n and charge compensation zones 15 of a complementary conduction type p with respect to the first conduction type n. Furthermore, this partial region of a semiconductor chip structure 11 has a first metallization structure 16, which is electrically coupled to the charge compensation zones 15 via ohmic contacts 17 and to the drift zones 14 via Schottky contacts 18.

Furthermore, the semiconductor component 1 has a second metallization structure 19, which is arranged opposite the first metallization structure 16. The second metallization structure 19 is electrically coupled to the charge compensation zones 15 via Schottky contacts 18 and to the drift zones 14 via ohmic contacts 17. The semiconductor component 1 including a drift path structure 13 of this type is also referred to as a superjunction component. In this simplest case of a superjunction semiconductor component, the structure illustrated schematically in FIG. 1 can be used to realize a Schottky diode in which p-type minority charge carrier injection can no longer occur since no bipolar pn junctions are provided either on a first end 32 or on a second end 33 of the drift path. In this case, in the embodiment in accordance with FIG. 1, the top side 20 of the semiconductor body 12 coincides with the first end 32 and has alternately ohmic contacts 17 and Schottky contacts 18, which on the one hand make contact with the n-conducting drift zones 14 via Schottky contact junctions and on the other hand make contact with the charge compensation zones 15 via ohmic contacts 17.

On the opposite second end 33 of this drift path structure 13, which coincides with the rear side 21 of the semiconductor body 12 in the embodiment illustrated in FIG. 1, provision is then made alternately of Schottky contacts 18 for the charge compensation zones 15 and ohmic contacts 17 for the second ends 33 of the drift zones 14, such that, unlike in the prior art, bipolar pn junctions do not occur at the end of the charge compensation zones 15. Therefore, in this region of the semiconductor component, there is no occurrence of a high degree of charge carrier flooding as a result of minority charge carrier injection, rather the advantage of a vanishing reverse recovery charge of the unipolar Schottky contact junctions is utilized.

In one embodiment, the drift zones 14 and the charge compensation zones 15 are arranged vertically in the semiconductor body 12, such that they extend from the top side 20 of the semiconductor body 12 as far as the rear side 21 of the semiconductor body 12, wherein the rear side 21 of the semiconductor body 12 is provided with a cathode metallization structure 23 and the top side 20 of the semiconductor body has an anode metallization structure 22.

On the anode side, the charge compensation zones 15 are provided with ohmic contacts and the n-conducting drift zones 14 include the Schottky contacts 18. On the cathode side, which in this case also forms the rear side 21 of the semiconductor body 12, the arrangement of ohmic contacts 17 and Schottky contacts 18 is correspondingly reversed. This results in a semiconductor component 1 having a high reverse voltage when the cathode has a positive potential relative to the anode. In the on-state case, when the anode acquires a positive polarity relative to the cathode, both n-type and p-type zones act as Schottky diodes in the forward direction with the low threshold voltage of between 0.2 and 0.4 V already described above. As a result, the p-conducting charge compensation zones 15 not only serve as charge compensation regions for the n-conducting drift zones 14 but also contribute to improving the forward conductivity of the semiconductor component 1.

The potentials during the on-state phase supply between the charge compensation zones 15 and the drift zones 14 a low forward bias of approximately 0.3 V, which is generated by the Schottky contacts 18 on the two sides lying opposite one another and is maintained over the entire depth of the semiconductor component 1. Consequently, there is no initiation of a high degree of minority charge carrier injection during the normal operation of such a structure. One advantage of such a structure is that, on the one hand, the conductivity in the on-state phase is increased further even if superjunction structures having already improved forward conductivity are used, and that, on the other hand, essentially no injection of minority charge carriers occurs, such that the semiconductor component 1 operates as a rapidly switching component like a conventional Schottky diode, but with maximum breakdown voltage.

In order to produce a plurality of such semiconductor chips for semiconductor components 1, at least the following method processes are provided. The first process involves patterning a semiconductor wafer made from a semiconductor body 12 for such a semiconductor component 1 which has a drift path structure 13 with drift zones 14 and charge compensation zones 15. A first metallization structure 16 is subsequently applied to this basic structure, the first metallization structure forming Schottky contacts 18 on first ends 32 of the drift zones 14 and ohmic contacts 17 on first ends 32 of the charge compensation zones 15.

Afterward, in order to produce a semiconductor component 1 as illustrated in FIG. 1, a second metallization structure 19 is applied to the rear side 21 of the semiconductor body 12, that is to say to the rear side of the semiconductor wafer, the second metallization structure forming ohmic contacts 17 on the second ends 33 of the drift zones 14 and Schottky contacts 18 on the second ends 33 of the charge compensation zones 15. Different metal alloys can be used in order to enable this formation of Schottky contacts 18. By way of example, a first metal alloy can be applied selectively on the n-conducting material on the top side 20 of the semiconductor body 12, the first metal alloy forming Schottky contact junctions 18. A different metal alloy can be selectively applied to the p-conducting material of the charge compensation zones 15, the metal alloy, on the p-conducting charge compensation zones 15, providing ohmic contacts 17 on the top side 20 of the semiconductor body 12.

In one embodiment, the cross section of the charge compensation zones 15 and of the drift zones 14 in a lateral direction can be in stripe form or else in pillar form. In principle, each drift zone region is surrounded by charge compensation zone regions, and vice-versa. Metal alloys which form Schottky contact junctions 18 on p-conducting charge compensation material and provide ohmic contacts 17 on n-conducting drift zone material are used on the rear side 21.

After the application of these different metal alloys, depending on whether they are intended to form a Schottky contact 18 to a semiconductor surface or ohmic contacts 17, the top side of the semiconductor wafer can be completely provided with an anode metallization structure 22 and the rear side of the semiconductor wafer can be coated with a cathode metallization structure 23. In order to complete a semiconductor component 1 in the form of a semiconductor diode with a vertical superjunction structure, it is then only necessary for the semiconductor wafer including semiconductor chip structures 11 of this type to be separated into individual semiconductor chips. Finally, the semiconductor chips have to be incorporated into individual housings with corresponding external connections leading toward the outside.

By preparing the zones near the surface which are intended to afford an ohmic contact-connection, for example, a higher dopant concentration of the respective conduction type can be introduced both in the region of the charge compensation zones 15 on the top side 20 of such a structure and on the opposite end in the region of the drift zones 14. Such a method has one advantage that possibly for the metallization of the anode and also for the metallization of the cathode, one and the same metal alloy forms ohmic contacts 17 on the highly doped material and has Schottky contact junctions 18 on the more lightly doped regions. Such an example is illustrated by the next embodiment of the invention.

Figure 2:
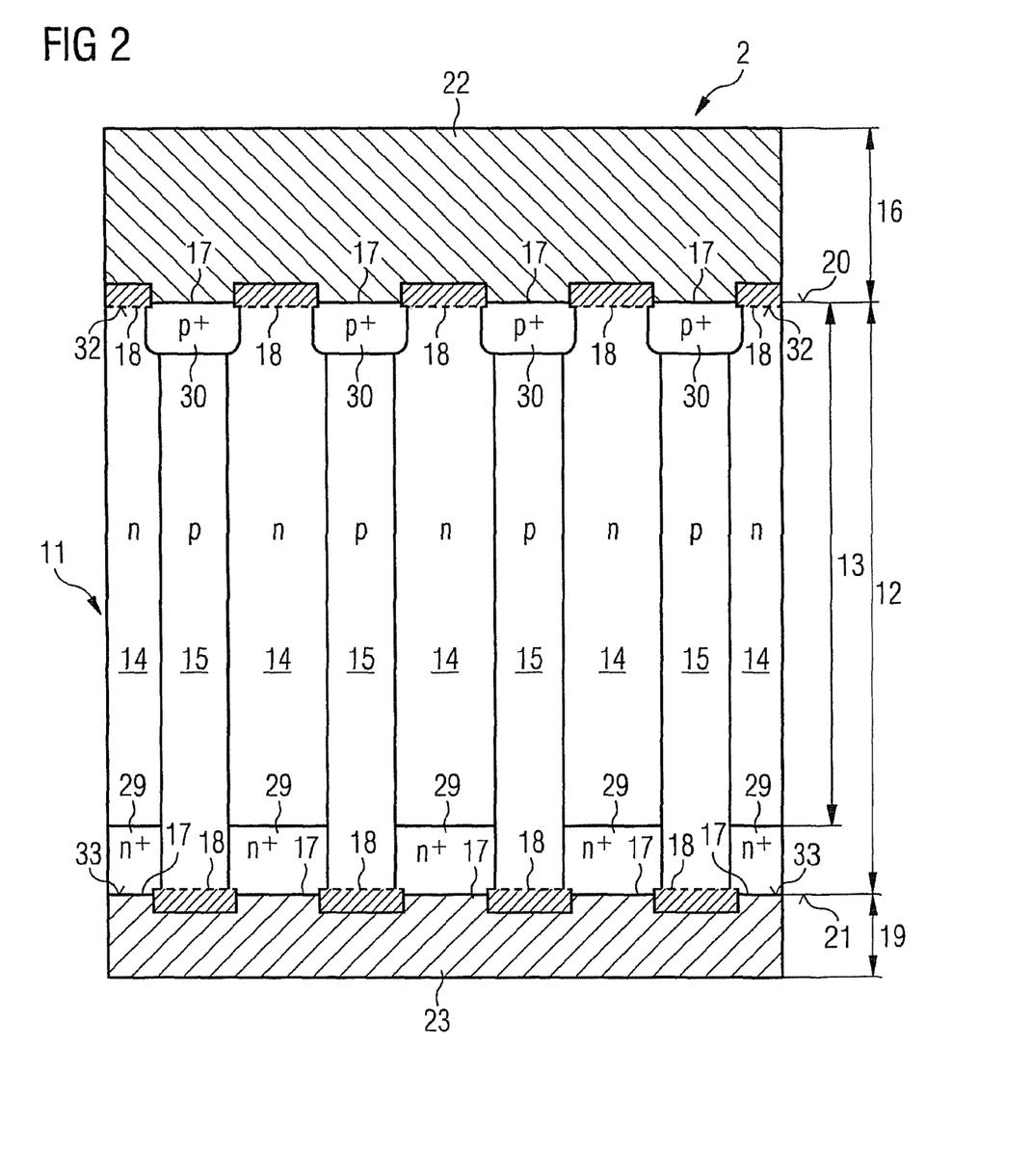
FIG. 2 illustrates a schematic cross section through a partial region of a semiconductor chip structure for a semiconductor component of a further embodiment.

FIG. 2 illustrates a schematic cross section through a partial region of a semiconductor chip structure 11 for a semiconductor component 2 of a further embodiment. Components having the same functions as in FIG. 1 are identified by the same reference symbols and are not discussed separately. In the second embodiment, the first ends 32 of the charge compensation zones 15 are provided with a more highly doped $p^+$-conducting charge compensation zone contact material 30 in a junction region with respect to the first metallization structure 16, such that ohmic contacts 17 for charge compensation zones 15 can simultaneously arise with Schottky contact junctions 18 at the first ends 32 of the drift zones 14.

If only a single metal alloy is used for the first metallization structure 16, this has the advantage that it is possible to dispense with complicated alignment processes during the production of such a semiconductor component 2 on account of the self-alignment of the differently doped zones 14 and charge compensation zones 15. An $n^+$-conducting drift zone contact material 29 is correspondingly provided on the rear side 21 of the semiconductor body 12 in the drift zones 14, the drift zone contact material, with a single metal alloy for the second metallization structure 19, ensuring an ohmic contact junction 17 for the drift zones 14. With correspondingly chosen material for the second metallization structure 19, this material can simultaneously provide corresponding Schottky contact junctions 18 on the somewhat more lightly doped and complementarily conducting charge compensation zones 15, such that alignment processes and mask sets can be dispensed with during production in this case, too, since a self-alignment is associated with such predoped regions and the correspondingly adapted metal alloys for the second metallization structure 19.

Figure 3:
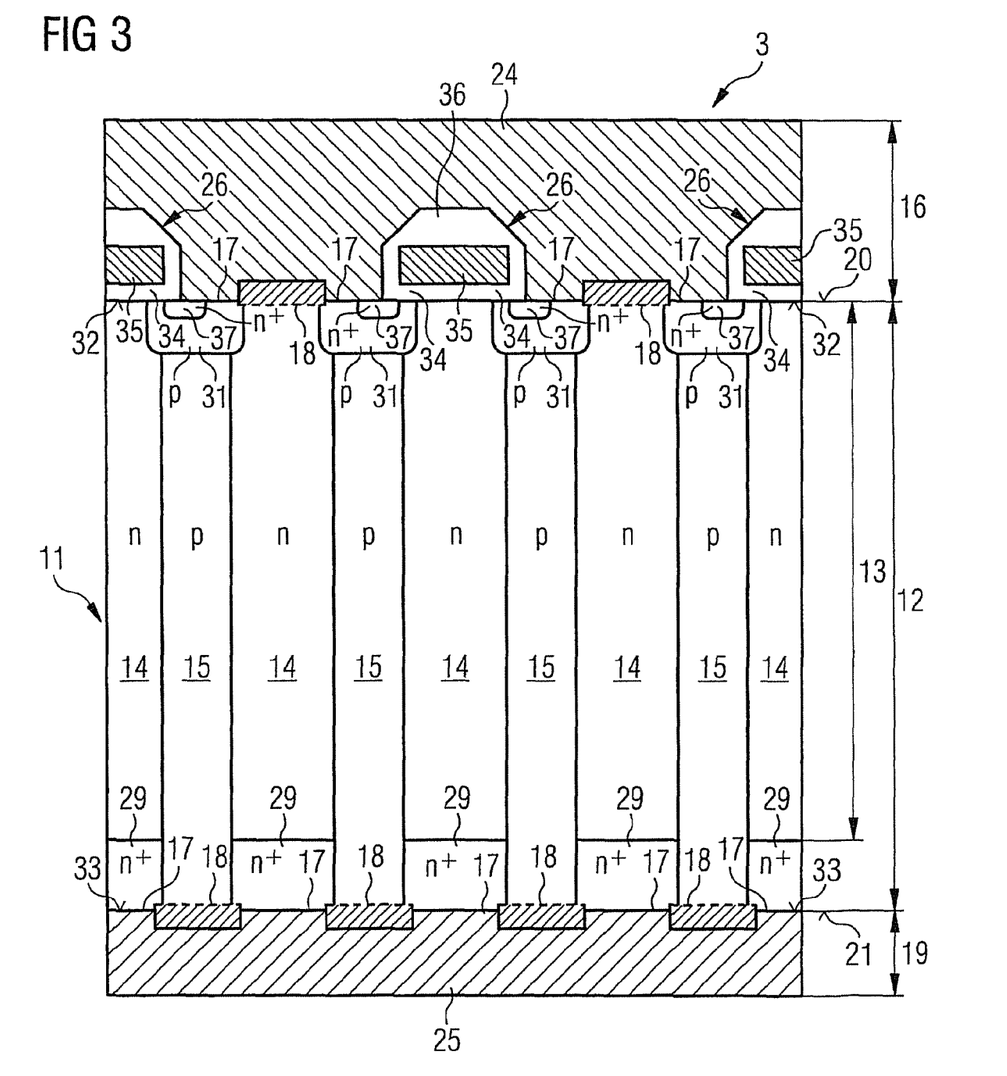
FIG. 3 illustrates a schematic cross section through a partial region of a semiconductor chip structure for a semiconductor component of a further embodiment.

FIG. 3 illustrates a schematic cross section through a partial region of a semiconductor chip structure 11 for a semiconductor component 3 of a further embodiment. This semiconductor chip structure 11 forms a superjunction transistor with an integrated Schottky diode as illustrated by FIG. 2. While the rear side of the semiconductor wafer of the second metallization structure 19 is constructed in the same way as already illustrated in FIG. 2, additional structures are provided at the top side 20 of the semiconductor wafer in order to introduce a lateral gate structure 26. This lateral gate structure 26 enables a channel to form between an $n^+$-conducting source zone region 37 and the drift zones 14 in a body zone 31 given a corresponding control potential at the lateral gate structure 26, such that a corresponding switching operation, as is known from MOSFET components, can be initiated.

In order to apply such a transistor structure on the top side of the semiconductor wafer, further processes are necessary which are to be carried out in a preparatory manner before the first metallization structure 16 is actually applied. Thus, for example a gate oxide 34 is to be applied at least above the planned channel region of the body zone 31, on which afterward a gate electrode 35 composed of highly doped polysilicon material is then arranged at least in the region of the planned control channel. The gate electrode 35 is insulated from the source metallization structure 24 illustrated here by an intermediate oxide structure 36 on the semiconductor body 12. In the regions in which neither a gate oxide 34 nor a gate electrode 35 is provided above the drift zones 14, corresponding Schottky contact junctions 18 can then be arranged in order to improve the switching properties of this semiconductor component, the junctions being provided between adjacent body zones 31 in this embodiment.

In this embodiment, charge compensation zones 15 are adjacent below the body zones 31, the charge compensation zones reaching as far as the rear side 21 of the semiconductor body 12 and being electrically coupled via unipolar Schottky contact junctions 18 to a drain metallization structure 25 on the rear side 21 of the semiconductor body 12. At the same time, the drift zones 14, which are provided with an n$^+$-conducting doping on their second end 33, are provided with ohmic contacts 17 by the drain metallization structure 25. In order to achieve such a drain metallization structure 25 on the rear side 21 of a semiconductor body 12, it is necessary for the second ends 33 of the charge compensation zones 15 to be uncovered.

In a method for producing semiconductor chip structures such as are necessary for a semiconductor component 3 illustrated in FIG. 3, the process, therefore, is such that firstly the structure illustrated in FIG. 3 is constructed on a relatively thick semiconductor wafer having a thickness of several hundreds of micrometers. This is followed by completing the first metallization structure 16 with lateral gate structure 26 on the top side 20. Afterward, this semiconductor wafer with corresponding semiconductor chips is thinned from the rear side of the semiconductor wafer by using corresponding grinding and chemical mechanical polishing methods, such that second ends 33 of the charge compensation zones 15 can be accessed.

Only such a method of thinning semiconductor wafers by polishing makes it possible to produce such superjunction transistors with integrated Schottky diodes in accordance with FIG. 3. In this case, the semiconductor wafers are thinned in part down to thicknesses of less than 50 μm (micrometers), depending on what reverse voltage is intended to be achieved with the corresponding semiconductor component structures. In this case, the principle holds true that the higher the required breakdown voltage of the semiconductor component 3, the greater the thickness with which the superjunction transistor structure has to be provided.

Figure 4:
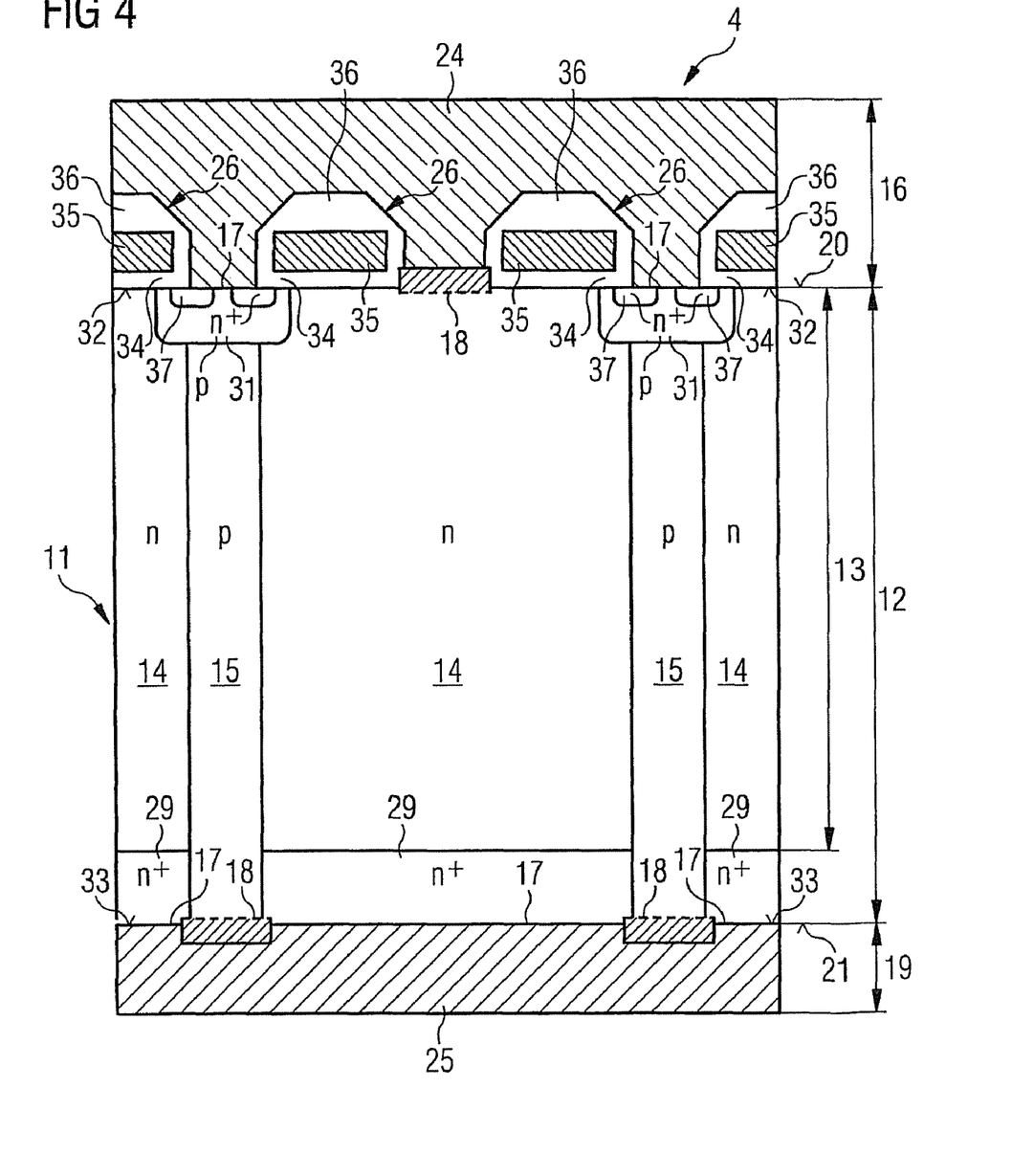
FIG. 4 illustrates a schematic cross section through a partial region of a semiconductor chip structure for a semiconductor component of a further embodiment.

FIG. 4 illustrates a schematic cross section through a partial region of a semiconductor chip structure 11 for a semiconductor component 4 of a further embodiment. Components having the same functions as in FIG. 3 are identified by the same reference symbols and are not discussed separately. The difference between these two components is that the drift zone region is provided in wider fashion than the charge compensation zone region. For this purpose, the dopings in the drift zone 14 are made correspondingly lower than the dopings in the charge compensation zones 15.

At the same time, body zones 31 are provided on the top side 20 of the semiconductor body 12, the body zones each having two switchable channels by virtue of two adjacent lateral gate structures 26 being provided above a respective body zone 31. On the top side 20 of the semiconductor body 12, the drift zones 14, as in the previous embodiments, are connected by the source metallization structure 24 with Schottky contact junctions 18, while on the rear side 21 of the semiconductor component 4 charge compensation zones 15 are electrically coupled to the drain metallization structure 25 via Schottky contact junctions 18. The ohmic linking of the charge compensation zones 15 at the top side 20 of the semiconductor body 12 is achieved here via the complementarily conducting body zone 31, which is electrically coupled to the source metallization structure 24 via a corresponding ohmic contact 17. This semiconductor component 4 also provides for thinning a semiconductor wafer until the second ends 33 of the charge compensation zones 15 are freely accessible for a corresponding Schottky contact metallization.

Figure 5:
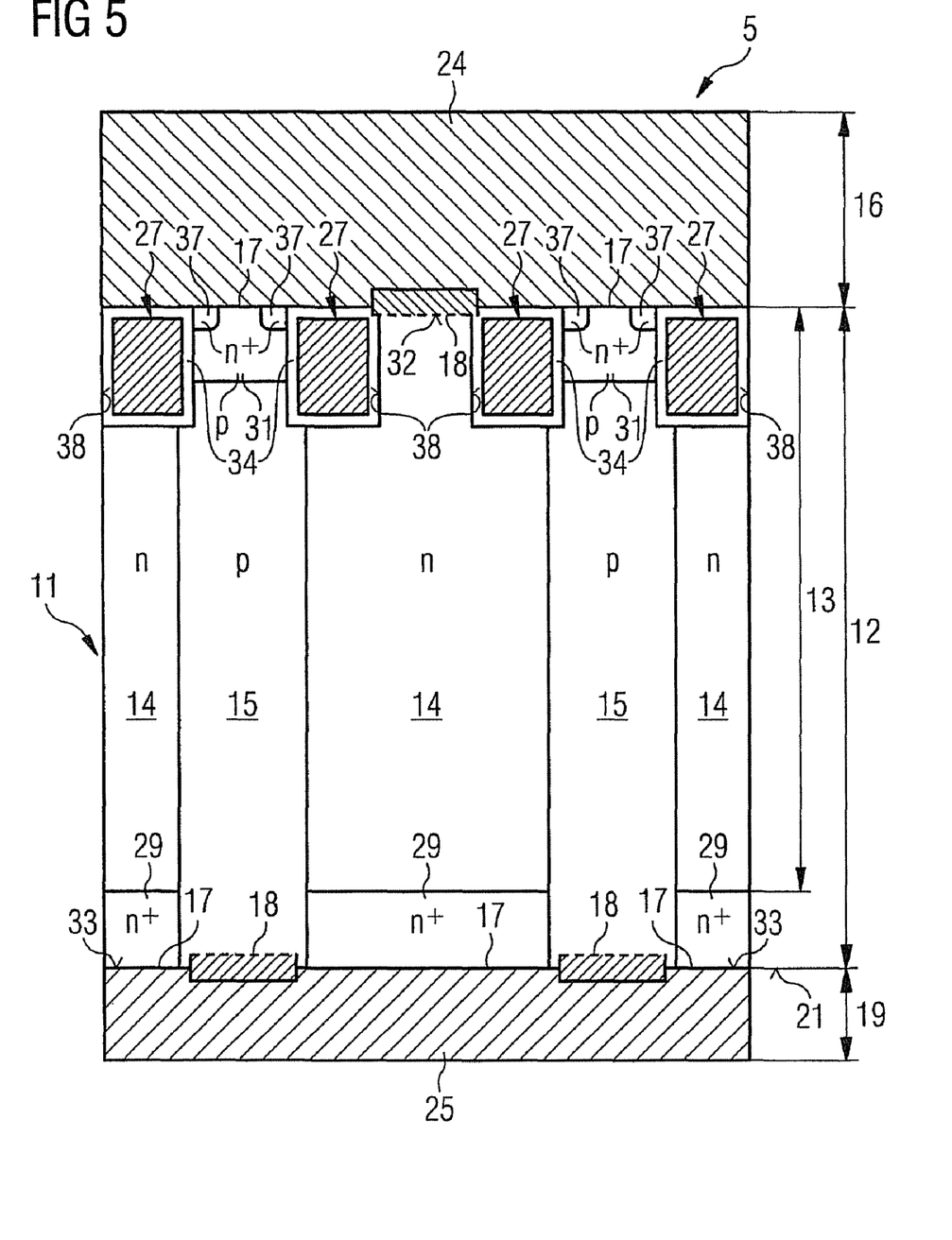
FIG. 5 illustrates a schematic cross section through a partial region of a semiconductor chip structure for a semiconductor component of a further embodiment.

FIG. 5 illustrates a schematic cross section through a partial region of a semiconductor chip structure 11 for a semiconductor component 5 of a further embodiment. Components having the same functions as in the previous figures are identified by the same reference symbols and are not discussed separately.

This basic schematic diagram in FIG. 5 illustrates a superjunction transistor with a trench gate structure 27 and an integrated Schottky diode. In this case, the principle is followed of producing ohmic contacts 17 in the upper region of charge compensation zones 15 and thus at the first end 32 of the charge compensation zones 15. In this transistor 5, the ohmic contacts 17 are ensured by the contact with the base zones 31. Specifically, the base zones 31 are electrically coupled to the source metallization structure 24 via ohmic contacts 17. The second, lower end 33 of the charge compensation zone 15 in this vertical semiconductor component 5 is embodied as a Schottky contact 18, such that a minority charge carrier injection into the regions of the charge compensation zones 15 is also avoided at the lower second end 33 of the charge compensation zones 15. This is because the Schottky diode is a unipolar component and has a forward voltage that is significantly less than the forward voltage of the pn junctions that have previously remained in superjunction components and been disclosed in the prior art.

At the first, upper end 32, the drift zones 14 are for their part electrically coupled to the source metallization structure 24 by a Schottky contact junction 18. The trench gate structure 27 is realized by virtue of the fact that a trench structure 38 is introduced into the semiconductor body 12 from the top side 20 of the semiconductor body 12 and then a vertical gate oxide layer 34 is realized by oxidation of the trench walls including the trench bottom or by deposition of oxides on the trench walls. The trench structure 28 can subsequently be filled with a conductive material, for example a highly doped polysilicon material, in order to form a trench gate structure 27. Given a corresponding bias voltage at the trench gate structure 27, a channel forms in the body zone region 31, the channel, proceeding from an n$^+$-conducting source zone region 37, reaching the n-conducting material of the drift zones 14 via the base zone 31 and partly along the charge compensation zones 15, such that the superjunction transistor with trench gate structure 27 and integrated Schottky diode turns on.

In the case of this semiconductor component 5 in accordance with FIG. 5, too, for making contact with the charge compensation zones 15 with the aid of Schottky contacts 18 on the rear side 21 of the semiconductor body 12, it is necessary to thin the semiconductor wafer until the charge compensation zones 15 are uncovered on the rear side 21 of the semiconductor body 12. By using the n+-conducting drift zone contact materials 29 that are highly doped in the vicinity of the rear side 21 of the semiconductor body 12, it is also possible in the realization of such semiconductor components for a single metal alloy to produce both the ohmic contact 17 on the rear side 21 to the drift zones 14 and the Schottky contacts 18 to the second ends 33 of the more lightly doped charge compensation zones 15. Such complete thinning by grinding as far as the charge compensation zones 15 is not absolutely necessary, however, which is illustrated schematically in a further embodiment in the subsequent Figure.

Figure 6:
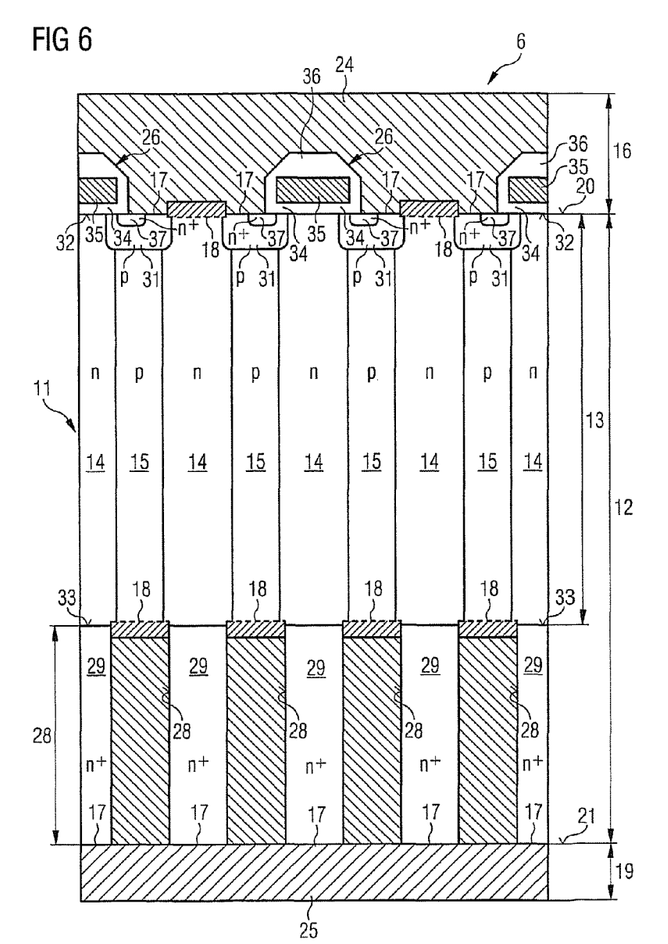
FIG. 6 illustrates a schematic cross section through a partial region of a semiconductor chip structure for a semiconductor component of a further embodiment.

FIG. 6 illustrates a schematic cross section through a partial region of a semiconductor chip structure 11 for a semiconductor component 6 of a further embodiment. In the case of this semiconductor component 6, firstly the lateral gate structure 26 as already illustrated in FIG. 3 was maintained on the top side 20 of the semiconductor body 12. From the rear side 21 of the semiconductor body 12, however, the semiconductor body or semiconductor wafer is not completely thinned, rather trench structures 28 are introduced into the semiconductor body 12 from the rear side 21 until the trench structures 28 uncover the second ends 33 of the charge compensation zones 15.

A Schottky material can then be introduced into these trench structures 28 on the rear side 21 of the semiconductor body 12, the Schottky material forming Schottky contacts 18 on the trench bottom in the region of the charge compensation zones 15. In this case, the entire trench structure 28 can be filled with Schottky material from the rear side 21 or, after the formation of a Schottky contact 18 in the trench bottom of the trench structure 28, the material of the drain metallization structure 25 can already be applied since ohmic contact is intended to be made with the n+-doped substrate by the drain metallization structure 25.

Whereas the previous embodiments relate to vertical superjunction semiconductor components, exemplary embodiments illustrating the possibilities of lateral superjunction components are also presented below.

Figure 7:
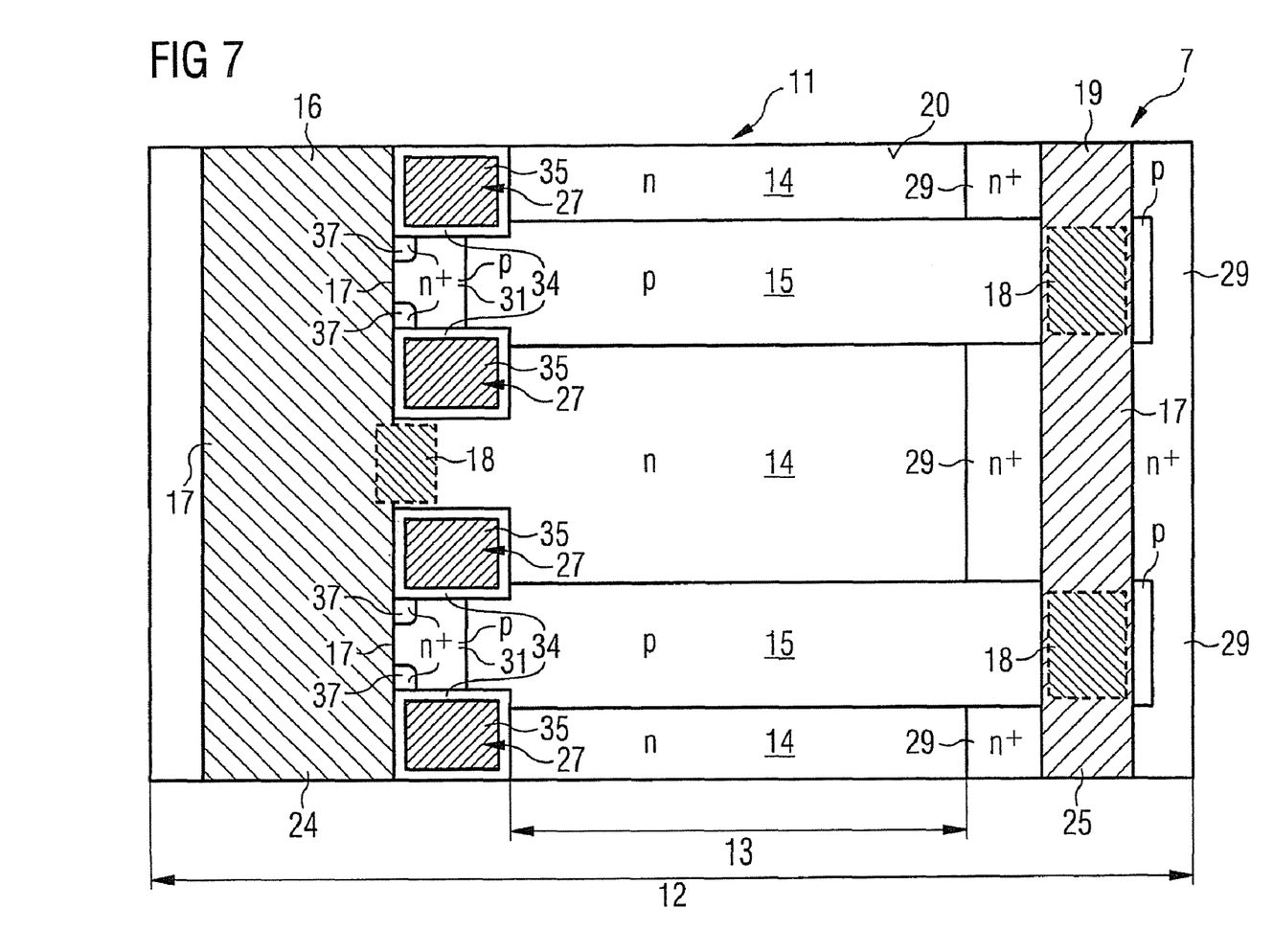
FIG. 7 illustrates a schematic plan view of a partial region of a semiconductor chip structure of a semiconductor component of a further embodiment.

FIG. 7 illustrates a schematic plan view of a partial region of a semiconductor chip structure 11 of a semiconductor component 7 of a further embodiment. For this purpose, in FIG. 7 on the left-hand side a source metallization structure 24 and on the right-hand side a drain metallization structure 25 are arranged in a manner lying opposite one another on the top side 20 of the semiconductor body 12. The source metallization structure 24 forms ohmic contacts 17 to the corresponding base zone 31 of the superjunction transistor, which emerge into charge compensation zones 15 of the same conduction type which extend right into the region of the drain metallization structure. On the side of the drain metallization structure 25, the charge compensation zones 15 are electrically coupled via Schottky contacts 18 of the drain metallization structure 25.

Conversely, the source metallization structure 24 makes contact with the drift zones 14 via Schottky contacts 18, while on the side of the drain metallization structure 25 the drift zones 14 are coupled to the drain metallization structure 25 via ohmic contacts 17. In order to improve the ohmic contact connection by the drain metallization structure 25, in the region of the drain metallization structure 25 an n+-conducting region is introduced into the semiconductor body 12 near the surface. The gate structure is once again formed as a trench gate structure 27 and has a gate oxide 34, via which it is possible to produce corresponding channels in the body zones 31 for turning on the superjunction transistor given a corresponding gate voltage.

Figure 8:
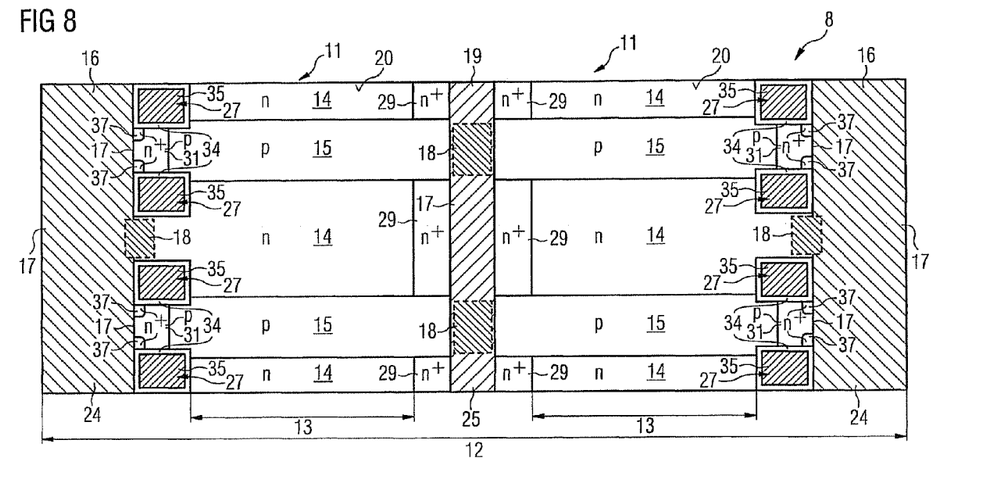
FIG. 8 illustrates a schematic plan view of a partial region of a semiconductor chip structure of a semiconductor component of a further embodiment.

FIG. 8 illustrates a schematic plan view of a partial region of a semiconductor chip structure 11 of a semiconductor component 8 of a further embodiment. Components having the same functions as in FIG. 7 are identified by the same reference symbols and are not discussed separately. The difference with respect to the previous embodiment is that source metallization structures 24 are in each case provided in the edge regions of the semiconductor chip, which source metallization structures interact with a drain metallization structure 25 in the center of the semiconductor chip.

In this case, the semiconductor component illustrated in FIG. 7 is merely mirrored in the region near the surface, such that two source metallization structures 24 with corresponding trench gate structures 27 interact with a drain metallization structure 25 in the center of the semiconductor component 8. In this case, the arrangement of the Schottky contacts 18 and of the ohmic contacts 17 corresponds to the concept according to the invention which provides Schottky contact junctions 18 to the drift zones 14 from the source metallization structure 24 and enables ohmic contact junctions 17 from the source metallization structure 24 to the charge compensation zones 15. By contrast, with the drain metallization structure 25 an ohmic contact connection 17 to the drift zones 14 is produced and Schottky contacts 18 to the charge compensation zones 15 in the drain metallization region are realized.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A semiconductor component with a drift path structure comprising:
   a first metallization structure electrically coupled to charge compensation zones via an ohmic contact and to drift zones via a Schottky contact;
   a second metallization structure, arranged opposite the first metallization structure and electrically coupled to the charge compensation zones via a Schottky contact and to the drift zones via an ohmic contact.

2. The semiconductor component of claim 1, wherein the first metallization structure is arranged opposite the second metallization structure on a common top side of the semiconductor body and wherein the first metallization structure and the second metallization structure comprise a lateral superjunction component.

3. The semiconductor component of claim 1, wherein the first metallization structure is arranged on a top side of the semiconductor body and the second metallization structure is arranged on a rear side of the semiconductor body and wherein the first metallization structure and the second metallization structure provide a vertical superjunction component.

4. The semiconductor component of claim 1, wherein the first metallization structure includes an anode metallization structure and the second metallization structure includes a cathode metallization structure of a superjunction diode.

5. The semiconductor component of claim 1, wherein the first metallization structure includes a source metallization structure and the second metallization structure includes a drain metallization structure of a superjunction field effect transistor.

6. A semiconductor component, including a semiconductor chip structure with a semiconductor body and a drift path structure, wherein the drift path structure comprises:
   drift zones of a first conduction type;
   charge compensation zones of a complementary conduction type;
   a first metallization structure electrically coupled to the charge compensation zones via an ohmic contact and to the drift zones via a Schottky contact;
   a second metallization structure, arranged opposite the first metallization structure and electrically coupled to the charge compensation zones via a Schottky contact and to the drift zones via an ohmic contact.

7. The semiconductor component of claim 6, wherein the first metallization structure includes a single metal alloy, the single metal alloy including an ohmic contact on charge compensation zones of the semiconductor body and a Schottky contact on drift zones of the semiconductor body.

8. The semiconductor component of claim 6, wherein the second metallization structure includes a single metal alloy, the single metal alloy including an ohmic contact on drift zones of the semiconductor body and a Schottky contact on charge compensation zones of the semiconductor body.

9. The semiconductor component of claim 6, wherein the semiconductor component includes a lateral gate structure.

10. The semiconductor component of claim 6, wherein the semiconductor component includes a vertical trench gate structure.

11. The semiconductor component of claim 6, wherein the semiconductor component includes a vertical drift path structure with a thinned semiconductor body, the thickness of the thinned semiconductor body corresponding approximately to the length of the vertical charge compensation zones.

12. A semiconductor component, wherein the semiconductor component includes a semiconductor chip structure with a semiconductor body and with a drift path structure, and wherein the drift path structure comprises:
   drift zones of a first conduction type;
   charge compensation zones of a complementary conduction type;
   a first metallization structure electrically coupled to the charge compensation zones via an ohmic contact and to the drift zones via a Schottky contact;
   a second metallization structure, arranged opposite the first metallization structure and electrically coupled to the charge compensation zones via a Schottky contact and to the drift zones via an ohmic contact; and
   wherein the semiconductor component includes a vertical drift path structure, and wherein the second metallization structure is arranged on the rear side of the semiconductor body and the Schottky contacts to the charge compensation zones are arranged in trench structures.

13. The semiconductor component of claim 12, wherein the trench structures are completely filled with a metal alloy, the metal alloy forming Schottky contacts.

14. The semiconductor component of claim 12, wherein the trench structures are filled with a metal alloy, the metal alloy forming Schottky contacts, in the region of the charge compensation zones.

* * * * *